(12) United States Patent
Jeong

(10) Patent No.: US 8,232,577 B2
(45) Date of Patent: Jul. 31, 2012

(54) LIGHT EMITTING DEVICE

(75) Inventor: Hwan Hee Jeong, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 0 days.

(21) Appl. No.: 13/028,615

(22) Filed: Feb. 16, 2011

(65) Prior Publication Data
US 2011/0260186 A1 Oct. 27, 2011

(30) Foreign Application Priority Data
Apr. 23, 2010 (KR) .................. 10-2010-0037945

(51) Int. Cl.
*H01L 33/00* (2010.01)

(52) U.S. Cl. ............ 257/99; 257/79; 257/183; 257/184; 257/200; 257/201

(58) Field of Classification Search ............ 257/79–103, 257/183, 184, 189, 200, 201, 257, E33.01, 257/E33.016, E33.028
See application file for complete search history.

(56) References Cited

U.S. PATENT DOCUMENTS

| | | | |
|---|---|---|---|
| 7,049,635 B2* | 5/2006 | Sano et al. | 257/79 |
| 7,928,464 B2* | 4/2011 | Lee et al. | 257/99 |
| 8,022,428 B2* | 9/2011 | Jeong | 257/98 |
| 2004/0104390 A1 | 6/2004 | Sano et al. | |
| 2005/0236632 A1 | 10/2005 | Lai et al. | |
| 2006/0163599 A1 | 7/2006 | Tsai et al. | |
| 2007/0057272 A1 | 3/2007 | Urashima | |
| 2008/0035949 A1 | 2/2008 | Fudeta et al. | |
| 2008/0048202 A1* | 2/2008 | Tazima et al. | 257/98 |
| 2008/0308829 A1 | 12/2008 | Liu et al. | |
| 2009/0261370 A1 | 10/2009 | Jeong | |
| 2010/0006881 A1 | 1/2010 | Seo et al. | |

FOREIGN PATENT DOCUMENTS

| | | |
|---|---|---|
| EP | 2 194 585 A1 | 6/2010 |
| EP | 2 216 833 A1 | 8/2010 |
| EP | 2 219 240 A2 | 8/2010 |
| EP | 2 228 838 A1 | 9/2010 |
| JP | 2007-080924 A | 9/2005 |

* cited by examiner

*Primary Examiner* — Steven Loke
*Assistant Examiner* — Cuong Nguyen
(74) *Attorney, Agent, or Firm* — McKenna Long & Aldridge LLP

(57) ABSTRACT

A light emitting device according to the embodiment may include a light emitting structure including a first semiconductor layer, an active layer, and a second semiconductor layer; a first electrode on the light emitting structure; and a protection layer including a first metallic material on an outer peripheral region of one of the light emitting structure and the first electrode.

15 Claims, 10 Drawing Sheets

LIGHT EMITTING DEVICE

The present application claims priority of Korean Patent Application No. 10-2010-0037945 filed on Apr. 23, 2010, which is hereby incorporated by reference in its entirety as if fully set forth herein.

BACKGROUND

The embodiment relates to a light emitting device.

Light emitting diodes (LEDs) are semiconductor devices that convert electric energy into light. The LED is advantageous as compared with conventional light sources, such as a fluorescent lamp or a glow lamp, in terms of power consumption, life span, response speed, safety and environmental-friendly requirement. In this regard, various studies have been performed to replace the conventional light sources with the LEDs. The LEDs are increasingly used as light sources for lighting devices such as various lamps, liquid crystal displays, electric signboards, and street lamps.

SUMMARY

The embodiment provides a light emitting device having a novel structure.

The embodiment provides a light emitting device capable of improving the reliability.

A light emitting device according to the embodiment may include a light emitting structure including a first semiconductor layer, an active layer, and a second semiconductor layer; a first electrode on the light emitting structure; and a protection layer including a first metallic material on an outer peripheral region of one of the light emitting structure and the first electrode.

A light emitting device according to the embodiment may include an electrode including a support member having conductivity; an adhesive layer on the electrode; a protection layer including a plurality of layers on an outer peripheral region of a top surface of the electrode; and a light emitting structure including a first semiconductor layer, an active layer, and a second semiconductor layer on the electrode and the protection layer, wherein the layers include a first layer contacting the adhesive layer, a second layer on the first layer, and a third layer contacting the first semiconductor layer, the first and third layers include a first metallic material, and the second layer includes at least one selected from the group consisting of an insulating material, a conductive material, and a second metallic material.

DETAILED DESCRIPTION OF THE EMBODIMENTS

Figure 1:
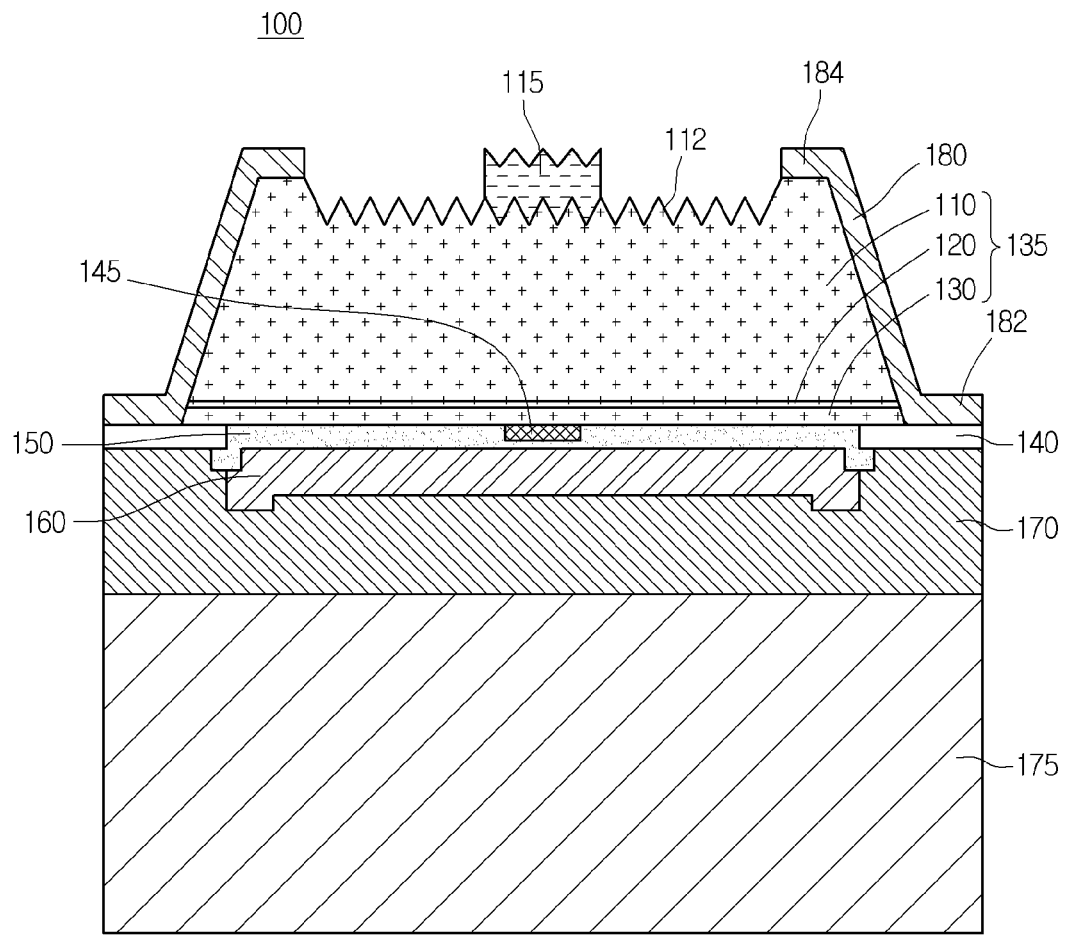
FIG. 1 is a side sectional view showing a light emitting device according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Hereinafter, embodiments will be described with reference accompanying drawings. The thickness and size of each layer shown in the drawings may be exaggerated, omitted or schematically drawn for the purpose of convenience or clarity. In addition, the size of elements does not utterly reflect an actual size.

FIG. 1 is a side sectional view showing a light emitting device 100 according to the first embodiment.

Referring to FIG. 1, the light emitting device 100 according to the embodiment includes a first electrode 175, an adhesive layer 170 on the first electrode 175, a reflective layer 160 on the adhesive layer 170, an ohmic contact layer 150 on the reflective layer 160, a protection layer 140 on a peripheral region of a top surface of the adhesive layer 170, a light emitting structure 135 formed on the ohmic contact layer 150 and the protection layer 140 to generate light, and a second electrode 115 on the light emitting structure 135.

The first electrode 175 supports a plurality of layers formed thereon and has a function of an electrode. In detail, the first electrode 175 may include a support member having conductivity. The first electrode 175, together with the second electrode 115, supplies power to the light emitting structure.

For instance, the first electrode 175 may include at least one selected from the group consisting of Ti, Cr, Ni, Al, Pt, Au, W, Cu, Mo, Cu—W and a carrier wafer including Si, Ge, GaAs, ZnO, SiC, or SiGe.

A thickness of the first electrode 175 may vary depending on the design of the light emitting device 100. For instance, the first electrode 175 has a thickness of about 30 μm to about 500 μm.

The first electrode 175 can be plated and/or deposited below the light emitting structure 135 or can be attached in the form of a sheet, but the embodiment is not limited thereto.

The adhesive layer 170 may be formed on the first electrode 175. The adhesive layer 170 is a bonding layer formed under the reflective layer 160 and the protection layer 140. Outer side surfaces of the adhesive layer 170 are exposed and the adhesive layer 170 makes contact with the reflective layer 160, an end of the ohmic contact layer 150 and the protection layer 140 to serve a mediator for reinforcing the bonding strength of the first electrode 175 with respect to the protection layer 140, the ohmic contact layer 150 and the reflective layer 160.

The adhesive layer 170 may include a barrier metal or a bonding metal. For instance, the adhesive layer 170 may include at least one selected from the group consisting of Ti, Au, Sn, Ni, Cr, Ga, In, Bi, Cu, Ag and Ta.

The reflective layer 160 may be formed on the adhesive layer 170. The reflective layer 160 reflects light incident from the light emitting structure 135 to improve the light extraction efficiency.

For instance, the reflective layer 160 may include metal or a metal alloy including at least one selected from the group consisting of Ag, Ni, Al, Rh, Pd, Ir, Ru, Mg, Zn, Pt, Au, and Hf, but the embodiment is not limited thereto. In addition, the reflective layer 160 can be prepared as a multiple layer by using the above metal and transparent conductive materials including one selected from the group consisting of IZO (In—ZnO), GZO (Ga—ZnO), AZO (Al—ZnO), AGZO (Al—Ga—ZnO), IGZO (In—Ga—ZnO), IZTO (indium zinc tin oxide), IAZO (indium aluminum zinc oxide), IGTO (indium gallium tin oxide) and ATO (aluminum tin oxide). For example, the reflective layer 160 has the multi-layer structure including one of IZO/Ni, AZO/Ag, IZO/Ag/Ni and AZO/Ag/Ni.

The ohmic contact layer 150 may be formed on the reflective layer 160. The ohmic contact layer 150 makes ohmic-contact with the first conductive semiconductor layer 130 to easily supply power to the light emitting structure 135.

In detail, the ohmic contact layer 150 selectively includes the transparent conductive material and the metal. For instance, the ohmic contact layer 150 can be prepared as a single layer or a multiple layer by using at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni, Ag, Ni/IrOx/Au and Ni/IrOx/Au/ITO.

The end portion of the ohmic contact layer 150 makes contact with the adhesive layer 170. An entire surface of the ohmic contact layer 150 makes contact with the first conductive semiconductor layer 130 except for a region overlapped with the protection layer 140. Since the ohmic contact layer 150 can make contact with the first conductive semiconductor layer 130 as wide as possible, the current can uniformly supplied to the active layer 120 through the entire surface of the first conductive semiconductor layer 130 making contact with the ohmic contact layer 150, so that the light emitting efficiency can be remarkably improved.

The ohmic contact layer 150 is provided therein with a current blocking layer 145 making contact with the first conductive semiconductor layer 130. The current blocking layer 145 may partially overlap with the second electrode 115 in the vertical direction. The current blocking layer 145 blocks the current supplied to the first conductive semiconductor layer 130 through the ohmic contact layer 150. Thus, the current supplied to the first conductive semiconductor layer 130 may be blocked at the current blocking layer 145 and the peripheral area of the current blocking layer. Therefore, the current blocking layer 145 can restrict the current from flowing through the shortest path between the first and second electrodes 175 and 115, so that the current is bypassed to the region between the ohmic contact layer 150 and the first conductive semiconductor layer 130, other that the current blocking layer 145. Accordingly, the current can uniformly flow over the whole area of the first conductive semiconductor layer 130, thereby remarkably improving the light emitting efficiency.

Although the current can be restricted from flowing the shortest path between the first and second electrodes 175 and 115, the current passing through the peripheral region of the current blocking layer 145 may flow to the first conductive semiconductor layer 130 adjacent to the current blocking layer 145 through the shortest path between the first and second electrodes 175 and 115. Thus, the amount of current flowing through the shortest path between the first and second electrodes 175 and 115 may be similar to the amount of current flowing to the first conductive semiconductor layer 130 through current paths other that the shortest path.

The current blocking layer 145 may include a material having electric conductivity lower than that of the ohmic contact layer 150, and electric insulating property while forming a schottky contact with respect to the first conductive semiconductor layer 130. For instance, the current blocking layer 145 may include at least one selected from the group consisting of ITO, IZO, IZTO, IAZO, IGZO, IGTO, AZO, ATO, ZnO, $SiO_2$, $SiO_x$, $SiO_xN_y$, $Si_3N_4$, $Al_2O_3$, $TiO_x$, Ti, Al and Cr.

Meanwhile, the current blocking layer 145 can be formed between the ohmic contact layer 150 and the first conductive semiconductor layer 130 or between the reflective layer 160 and the ohmic contact layer 150, but the embodiment is not limited thereto.

In addition, the current blocking layer 145 can be formed in a groove formed in the ohmic contact layer 150, can protrude out of the ohmic contact layer 150 or can be formed in a hole formed through the ohmic contact layer 150, but the embodiment is not limited thereto.

The protection layer 140 can be formed at an outer peripheral region of the top surface of the adhesive layer 170. That is, the protection layer 140 is formed at the outer peripheral region between the light emitting structure 135 and the adhesive layer 170.

At least a portion of the protection layer 140 overlaps with the light emitting structure 135 in the vertical direction. Since the protection layer 140 can make contact with the light emitting structure 135, the light emitting structure 135 can be effectively prevented from being delaminated from the adhesive layer 170.

The protection layer 140 may include a metallic material having superior adhesive property. For instance, the protection layer 140 may include at least one selected from the group consisting of Ti, Ni, Au, Ag, Ta, Pt, Pd, Rh, Ir and W. In this case, the protection layer 140 may reinforce the adhesive strength between the light emitting structure 135 and the adhesive layer 175, so that the reliability of the light emitting device 100 can be improved. In addition, the protection layer 140 may not be broken or fragments of the protection layer 140 may not be generated when the laser scribing process or the laser lift off (LLO) process is performed to break a plurality of chips into individual chip units, so that the reliability of the light emitting device 100 can be improved. In addition, if the protection layer 140 makes ohmic contact with the first conductive semiconductor layer 130, the current may flow through the protection layer 140. In this case, the active layer 120, which overlaps on the protection layer 140 in the vertical direction, can generate the light, so that the light emitting efficiency of the light emitting device 100 may be further improved. For instance, if the first conductive semiconductor layer 130 is a p type semiconductor layer, the protection layer 140 may include a metallic material, such as Ti, Ni or W, capable of forming the ohmic contact with respect to the p type semiconductor layer, but the embodiment is not limited thereto.

The light emitting structure 135 may be formed on the ohmic contact layer 150 and the protection layer 140.

The lateral sides of the light emitting structure 135 may be vertically or slantingly formed through the isolation etching, which is performed to break the chips into individual chip units. The top surface of the protection layer 140 may be partially exposed through the isolation etching.

The light emitting structure 135 may include a plurality of group III-V compound semiconductor materials.

The light emitting structure 135 may include the first conductive semiconductor layer 130, the active layer 120 on the first conductive semiconductor layer 130, and a second conductive semiconductor layer 110 on the active layer 120.

The first conductive semiconductor layer 130 can be formed on a part of the protection layer 140 and on the ohmic contact layer 150 and the current blocking layer 145. The first conductive semiconductor layer 130 may be a p type semiconductor layer including p type dopant. The p type semiconductor layer may include the group III-V compound semiconductor materials selected from the group consisting of GaN, AlN, AlGaN, InGaN, InN, InAlGaN, AlInN, AlGaAs, GaP, GaAs, GaAsP and AlGaInP. The p type dopant may include Mg, Zn, Ga, Sr or Ba. The first conductive semiconductor layer 130 can be prepared as a single layer or a multiple layer, but the embodiment is not limited thereto.

The first conductive semiconductor layer 130 supplies a plurality of carriers to the active layer 120.

The active layer 120 may include one of a single quantum well structure, a multiple quantum well (MQW) structure, a quantum wire structure and a quantum dot structure, but the embodiment is not limited thereto.

The active layer 120 may have a stack structure of well/barrier layers by using the group III-V compound semiconductor materials. The group III-V compound semiconductor materials used for the active layer may include GaN, InGaN, or AlGaN. Therefore, for instance, the active layer may be prepared as a stack structure of InGaN well/GaN barrier layers, InGaN well/AlGaN barrier layers, or InGaN well/InGaN barrier layers, but the embodiment is not limited thereto.

The active layer 120 emits the light corresponding to the band gap determined according to the semiconductor material of the active layer 120 through the recombination of holes injected through the first conductive semiconductor layer 130 and electrons injected through the second conductive semiconductor layer 110.

Although not shown in the drawings, a conductive clad layer can be formed on and/or under the active layer 120. The conductive clad layer may include an AlGaN-based semiconductor. For instance, a p type clad layer including p type dopant may be formed between the first conductive semiconductor layer 130 and the active layer 120, and an n type clad layer including n type dopant may be formed between the second conductive semiconductor layer 110 and the active layer 120.

The conductive clad layer serves as a guide for preventing holes and electrons injected into the active layer 120 from migrating to the first and second conductive semiconductor layers 130 and 110. Thus, a larger amount of holes and electrons are recombined in the active layer 120 due to the clad layer, so that the light emitting efficiency of the light emitting device 100 can be improved.

The second conductive semiconductor layer 110 can be formed on the active layer 120. The second conductive semiconductor layer 110 may be an n type semiconductor layer including n type dopant. The second conductive semiconductor layer 110 may include the group III-V compound semiconductor materials selected from the group consisting of GaN, AlN, AlGaN, InGaN, InN, InAlGaN, AlInN, AlGaAs, GaP, GaAs, GaAsP and AlGaInP. The n type dopant may include Si, Ge, Sn, Se or Te. The second conductive semiconductor layer 110 can be prepared as a single layer or a multiple layer, but the embodiment is not limited thereto.

A roughness or a concavo-convex pattern 112 can be formed on the top surface of the second conductive semiconductor layer 110 to improve the light extraction efficiency.

The roughness or the concavo-convex pattern 112 may be randomly formed through the wet etching or regularly formed through the patterning process, such as the photonic crystal structure, but the embodiment is not limited thereto.

The roughness or the concavo-convex pattern 112 may have periodic patterns. Concavo patterns and convex patterns of the roughness or the concavo-convex pattern 112 may be rounded or formed with lateral surfaces inclined at a predetermined angle about a vertex thereof.

Meanwhile, a semiconductor layer having a polarity opposite to that of the first conductive semiconductor layer 130 may be formed under the first conductive semiconductor layer 130. If the first conductive semiconductor layer 130 is a p type semiconductor layer, the second conductive semiconductor layer 110 is an n type semiconductor layer, or vice versa. Thus, the light emitting structure 145 may include at least one of N-P junction, P-N junction, N-P-N junction and P-N-P junction structures.

The second electrode 115 can be formed on the light emitting structure. The second electrode 115 may have a pattern shape locally formed on the light emitting structure 135. Although not shown in the drawings, the second electrode 115 may include an electrode pad area to which a wire is bonded and a current spreading pattern branching from the electrode pad area to uniformly supply current over the whole area of the light emitting structure.

When viewed in a plan view, the electrode pad area may have a rectangular shape, a circular shape, an oval shape, or a polygonal shape, but the embodiment is not limited thereto.

The second electrode can be prepared as a single-layer structure or a multi-layer structure by using at least one selected from the group consisting of Au, Ti, Ni, Cu, Al, Cr, Ag and Pt. In addition, the second electrode 115 may have a thickness (h) in the range of 1 μm to 10 μm, preferably, 2 μm to 5 μm.

When the second electrode 115 has the multi-layer structure, the second electrode 115 may include an ohmic layer (lowest layer) including a metal, such as Cr, to form an ohmic contact with respect to the light emitting structure 135, a reflective layer formed on the ohmic layer and including a metal, such as Al or Ag, having high reflectivity, a first diffusion barrier layer formed on the reflective layer and including a metal, such as Ni, for interlayer diffusion, a conductive layer formed on the first diffusion barrier layer and including a metal, such as Cu, having higher electric conductivity, and an adhesive layer formed on the conductive layer and including a metal, such as Au or Ti, having superior adhesive property, but the embodiment is not limited thereto.

In addition, the electrode pad area 116a and the current spreading pattern may have the stack structures identical to or different from each other. For instance, since the adhesive layer for wire bonding is not necessary for the current spreading pattern, the adhesive layer may be omitted. In addition, the current spreading pattern may include a material having transmittive and conductive properties. For instance, the current spreading pattern may include at least one selected from the group consisting of ITO, IZO, IZTO, IAZO, IGZO, IGTO, AZO, ATO, and ZnO.

If the roughness or the concavo-convex section 112 is formed on the top surface of the light emitting structure 135, the roughness or the concavo-convex section corresponding to the roughness or the concavo-convex section 112 may be formed on the top surface of the second electrode 115. Due to the roughness or the concavo-convex section of the second electrode 115, a reflective member 190 can be securely coupled with the second electrode 115.

The roughness or the concavo-convex section of the second electrode 115 can be formed through a patterning process.

A passivation layer 180 can be formed on at least one side of the light emitting structure 135. In detail, one end 184 of the passivation layer 180 is formed on the outer peripheral region of the top surface of the second conductive semiconductor layer 110, and the other end 182 of the passivation layer 180 may be formed on the top surface of the protection layer 140 by passing or crossing through the lateral side of the light emitting structure 135. In other words, the passivation layer 180 may extend from the top surface of the protection layer 140 to the outer peripheral region of the top surface of the second conductive semiconductor layer 110 by passing through the first conductive semiconductor layer 130, the active layer 120 and the second conductive semiconductor layer 110.

The passivation layer 180 may prevent the electric short from occurring between the light emitting structure 135 and the conductive member, such as an external electrode. For instance, the passivation layer 180 may include an insulating material including one selected from the group consisting of $SiO_2$, $SiO_x$, $SiO_xN_y$, $Si_3N_4$, $TiO_2$ and $Al_2O_3$, but the embodiment is not limited thereto.

Hereinafter, the method of manufacturing the light emitting device 100 according to the embodiment will be described in detail. In the following description, details of the elements and structures that have been previously described will be omitted or simplified to avoid redundancy.

FIGS. 2 to 11 are sectional views showing the method of manufacturing the light emitting device according to the embodiment.

Figure 2:
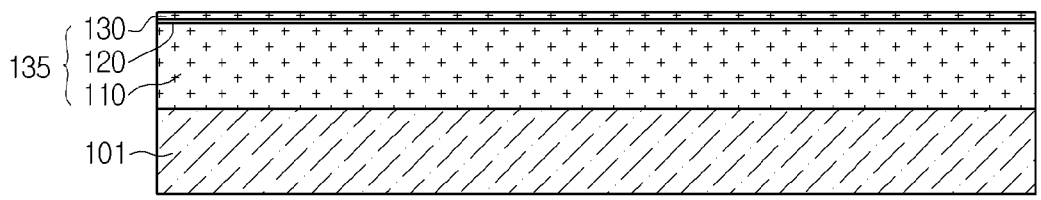
FIGS. 2 to 11 are sectional views showing a method of manufacturing the light emitting device according to the embodiment.

Referring to FIG. 2, the light emitting structure 135 is formed on a growth substrate 101.

The growth substrate 101 may include at least one selected from the group consisting of $Al_2O_3$, SiC, GaAs, GaN, ZnO, Si, GaP, InP and Ge, but the embodiment is not limited thereto.

The light emitting structure 135 can be formed by sequentially growing the second conductive semiconductor layer 110, the active layer 120, and the first conductive semiconductor layer 130 on the growth substrate.

The light emitting structure 135 can be formed through MOCVD (metal organic chemical vapor deposition), CVD (chemical vapor deposition), PECVD (plasma-enhanced chemical vapor deposition), MBE (molecular beam epitaxy), or HVPE (hydride vapor phase epitaxy), but the embodiment is not limited thereto.

A buffer layer (not shown) or an undoped semiconductor layer (not shown) can be formed between the light emitting structure 135 and the growth substrate 101 to attenuate the lattice mismatch between the light emitting structure 135 and the growth substrate 101.

The buffer layer may include InAlGaN, GaN, AlGaN, InGaN, AlInN, AlN, or InN, but the embodiment is not limited thereto.

Figure 3:
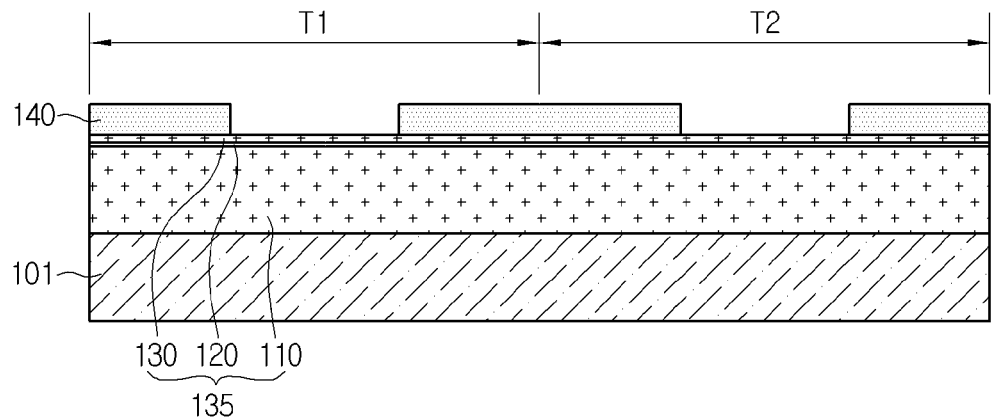

Referring to FIG. 3, the protection layer 140 is formed in the light emitting structure 135. In detail, the protection layer 140 is formed at the boundary region between a first chip region T1 and a second chip region T2 on the first conductive semiconductor layer 130. The first chip region T1 is separated from the second chip region T2 through the scribing process to form unit light emitting devices. Thus, the first and second chip regions T1 and T2 are defined as an area to form the unit light emitting devices.

The protection layer 140 can be formed at the boundary region between the first chip region T1 and the second chip region T2 by using a mask pattern. Since FIG. 3 is a two-dimensional section view, the protection layer 140 is illustrated as to be formed only on the boundary region between the first chip region T1 and the second chip region T2. Actually, the protection layer 140 is formed on all boundary regions of the chips. Thus, when viewed in a plan view, the protection layer 140 may have a ring shape, a loop shape or a frame shape. The protection layer 140 can be formed through various deposition schemes, such as sputtering, E-beam evaporation, or PECVD (plasma enhanced chemical vapor deposition).

The protection layer 140 may include a metallic material having superior adhesive property. For instance, the protection layer 140 may include at least one selected from the group consisting of Ti, Ni, Au, Ag, Ta, Pt, Pd, Rh, Ir and W. Thus, the protection layer 140 may reinforce the adhesive strength between the light emitting structure 135 and the adhesive layer 170 and improve the reliability of the light emitting device 100.

Figure 4:
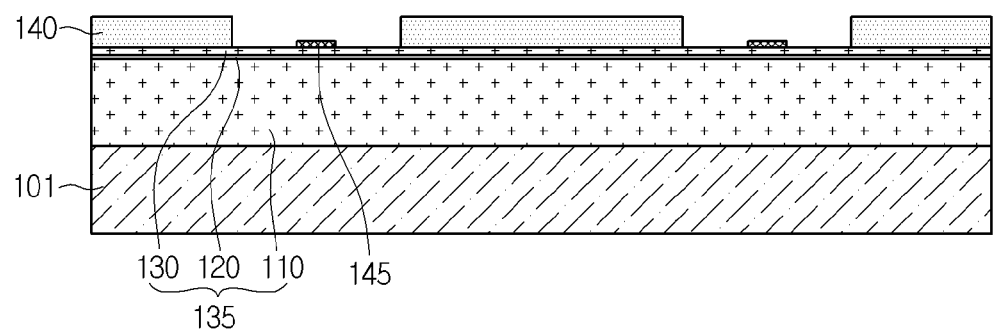

Referring to FIG. 4, the current blocking layer 145 is formed on the first conductive semiconductor layer 130. The current blocking layer 145 can be formed by using a mask pattern. The current blocking layer 145 is formed on the first conductive semiconductor layer 130 which at least partially overlaps with the second electrode 115 in the vertical direction.

The current blocking layer 145 may include a material having electric conductivity lower than that of the ohmic contact layer 150 and electric insulating property to form the schottky contact with respect to the first conductive semiconductor layer 130. For instance, the current blocking layer 145 may include at least one selected from the group consisting of ITO, IZO, IZTO, IAZO, IGZO, IGTO, AZO, ATO, ZnO, $SiO_2$, $SiO_x$, $SiO_xN_y$, $Si_3N_4$, $Al_2O_3$, $TiO_x$, Ti, Al, and Cr.

Figure 5:
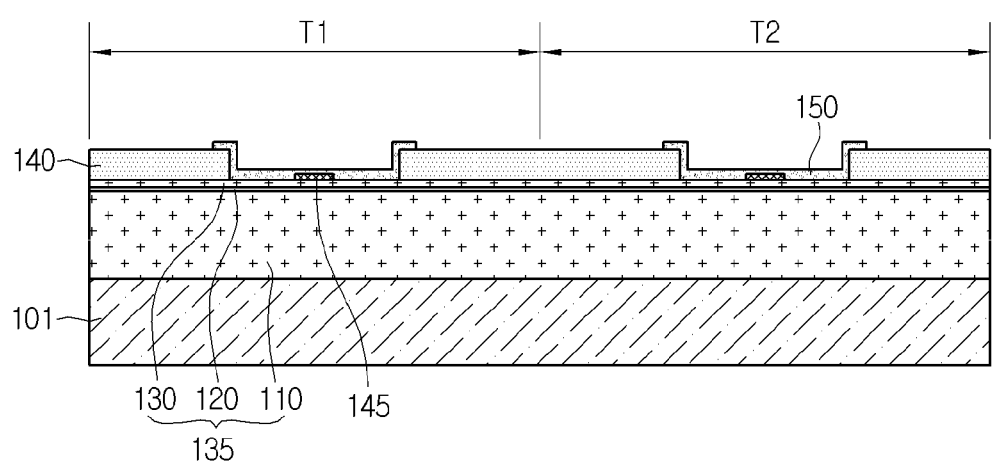
Figure 6:
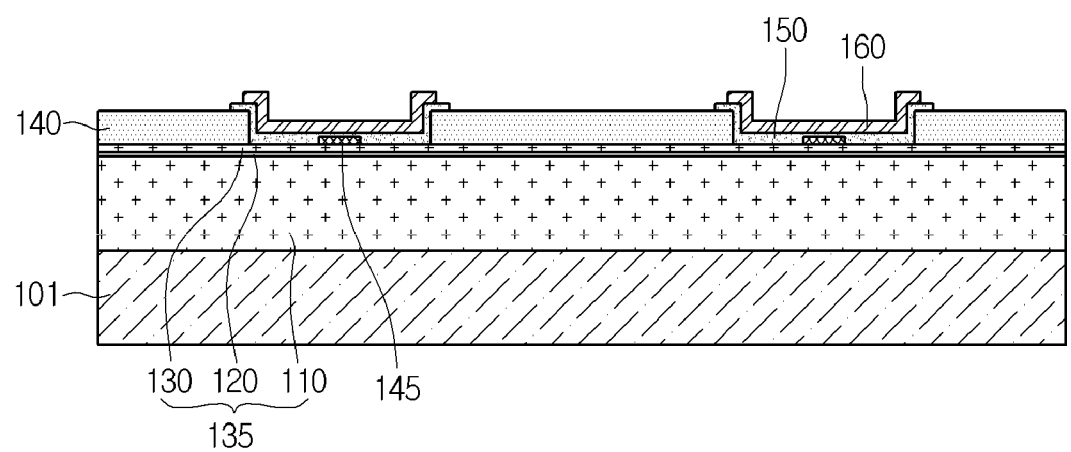

Referring to FIGS. 5 and 6, the ohmic contact layer 150 is formed on the top surfaces of the first conductive semiconductor layer 130 and the current blocking layer 145 and on the lateral side and a part of the top surface of the protection layer 140, and the reflective layer 160 is formed on the ohmic contact layer 150.

The ohmic contact layer 150 selectively includes the transparent conductive material and the metal. For instance, the ohmic contact layer 150 can be prepared as a single layer or a multiple layer by using at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni, Ag, Ni/IrOx/Au and Ni/IrOx/Au/ITO.

In addition, the reflective layer 160 may include at least one selected from the group consisting of Ag, Ni, Al, Rh, Pd, Ir, Ru, Mg, Zn, Pt, Au, and Hf. The reflective layer 160 may include an alloy including at least two of Ag, Ni, Al, Rh, Pd, Ir, Ru, Mg, Zn, Pt, Au, and Hf, but the embodiment is not limited thereto. The reflective layer 160 can be prepared as a multiple layer by using the above metal and transparent conductive materials including one selected from the group consisting of IZO (In—ZnO), GZO (Ga—ZnO), AZO (Al—ZnO), AGZO (Al—Ga—ZnO), IGZO (In—Ga—ZnO), IZTO (indium zinc tin oxide), IAZO (indium aluminum zinc oxide), IGTO (indium gallium tin oxide) and ATO (aluminum tin oxide).

The ohmic contact layer and the reflective layer 160 can be formed through one of E-beam evaporation, sputtering, and PECVD.

Figure 7:
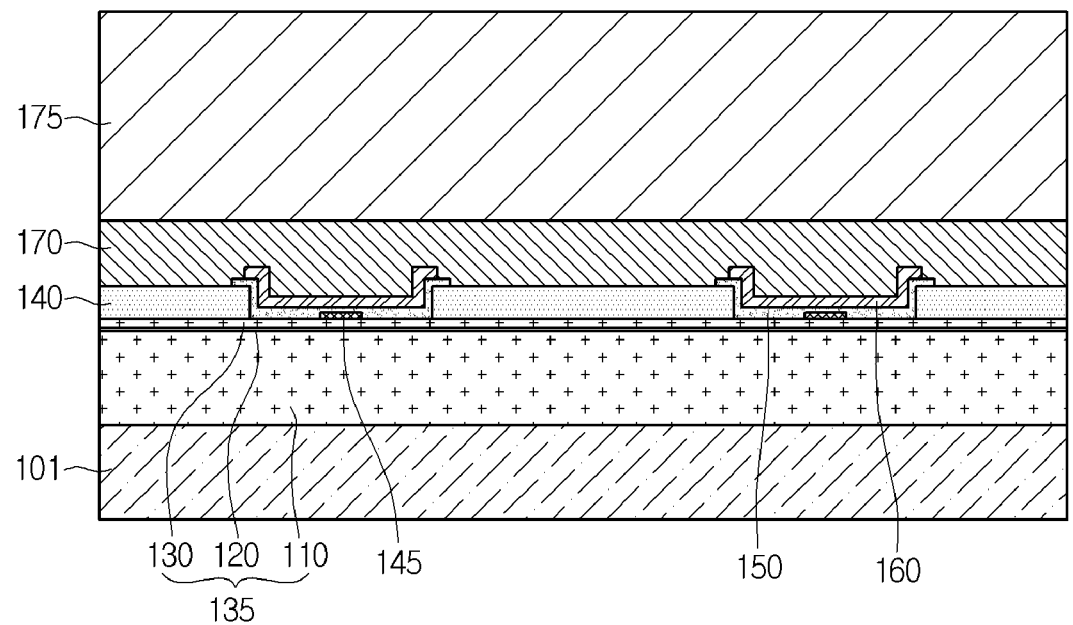

Referring to FIG. 7, the adhesive layer 170 is formed on the reflective layer 160 and the protection layer 140, and the first electrode 175 is formed on the adhesive layer 170.

The adhesive layer 170 makes contact with the reflective layer 160, the end of the ohmic contact layer 150, and the protection layer 140 to reinforce the adhesive strength among the reflective layer 160, the ohmic contact layer 150, and the protection layer 140.

The adhesive layer 170 may include a barrier metal or a bonding metal. The adhesive layer 170, for instance, may include at least one selected from the group consisting of Ti, Au, Sn, Ni, Cr, Ga, In, Bi, Cu, Ag and Ta.

For instance, the first electrode 175 may include at least one selected from the group consisting of Ti, Cr, Ni, Al, Pt, Au, W, Cu, Mo, Cu—W and a carrier wafer including Si, Ge, GaAs, ZnO, SiC, or SiGe.

If the adhesive layer 170 and the protection layer 140 are formed by using the same materials, the adhesive layer 170 can be integrally formed with the protection layer 140. In other words, the protection layer 140 may be derived from the adhesive layer 170.

In more detail, after sequentially forming the current blocking layer 145, the ohmic contact layer 150, and the reflective layer 160 on the first conductive semiconductor layer 130, the adhesive layer 170 is integrally formed with the protection layer 140. In this case, the efficiency of the manufacturing process for the light emitting device 100 can be improved.

The first electrode 175 can be prepared as a sheet attached to the adhesive layer 170. In addition, the first electrode 175 can be formed through the plating process or the deposition process, but the embodiment is not limited thereto.

Figure 8:
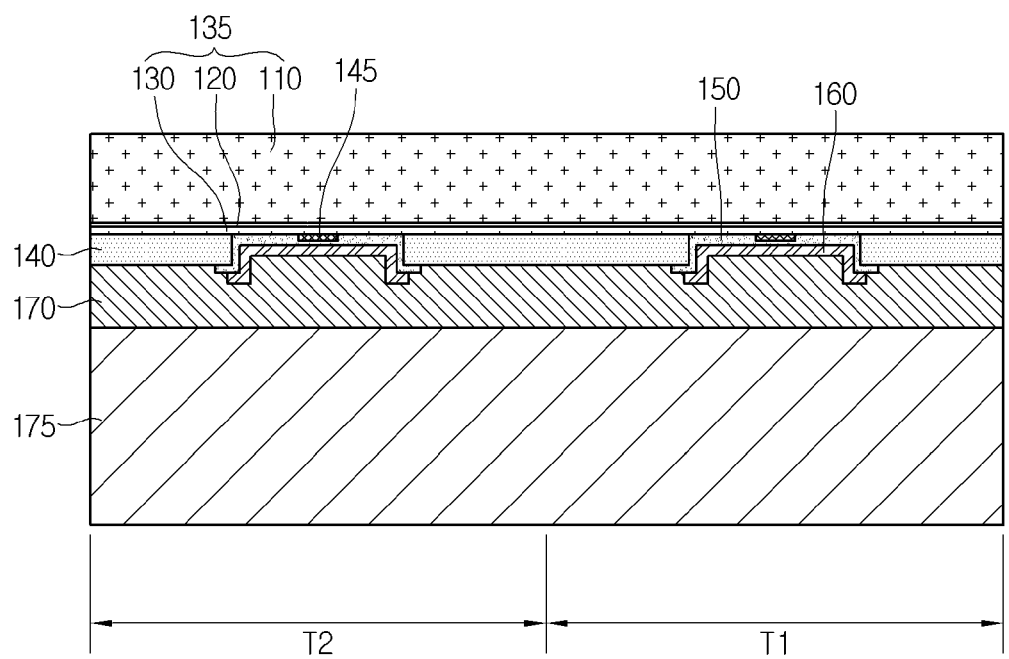

Referring to FIGS. 7 and 8, after turning over the light emitting device of FIG. 7, the growth substrate 101 is removed.

The growth substrate 101 can be removed through at least one of the LLO, CLO (chemical lift off) and physical polishing.

According to the LLO scheme, the laser is irradiated onto the interfacial surface between the growth substrate 101 and the second conductive semiconductor layer 110 to remove the growth substrate 101 from the second conductive semiconductor layer 110.

According to the CLO scheme, the growth substrate 101 is removed through the wet etching such that the second conductive semiconductor layer 110 can be exposed.

According to the physical polishing scheme, the growth substrate 101 is sequentially removed from the top surface thereof by physically polishing the growth substrate 101 until the second conductive semiconductor layer 110 is exposed.

The protection layer 140 may not be broken or fragments of the protection layer 140 may not be generated when the laser lift off process is performed, so that the reliability of the manufacturing process for the light emitting device 100 can be improved.

After the growth substrate 101 has been removed, the cleaning process may be additionally performed to remove residues of the growth substrate 101 from the top surface of the second conductive semiconductor layer 110. The cleaning process may include a plasma surface treatment process or an ashing process using oxygen or nitrogen.

Figure 9:
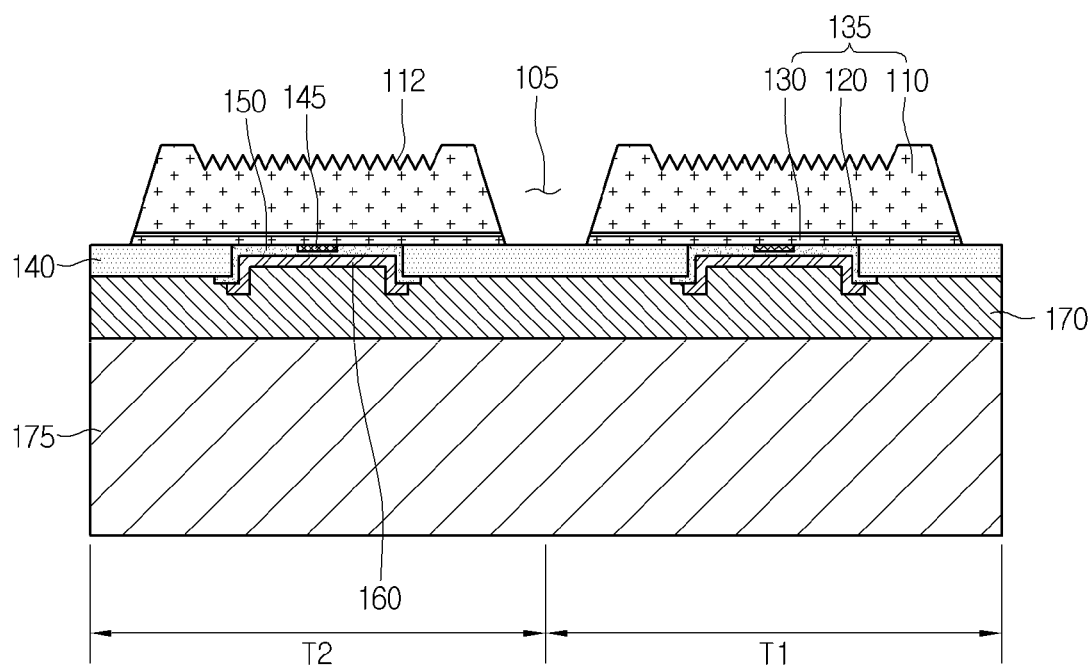

Referring to FIG. 9, the isolation etching is performed along the boundary region 105 between the first and second chip regions T1 and T2, thereby defining unit chip regions including the light emitting structure 135. As the isolation etching is performed, the protection layer 140 formed at the boundary region 105 between the first and second chip regions T1 and T2 may be exposed. The unit chip region signifies an area where the unit light emitting device is formed after the breaking process, such as the scribing process.

The isolation etching may include a dry etching, such as inductively coupled plasma etching.

In addition, the roughness or the concavo-convex pattern 112 can be formed on the top surface of the first conductive semiconductor layer 130 to improve the light extraction efficiency. The roughness or the concavo-convex pattern 112 may be randomly formed through the wet etching or regularly formed by using a mask pattern, but the embodiment is not limited thereto.

Figure 10:
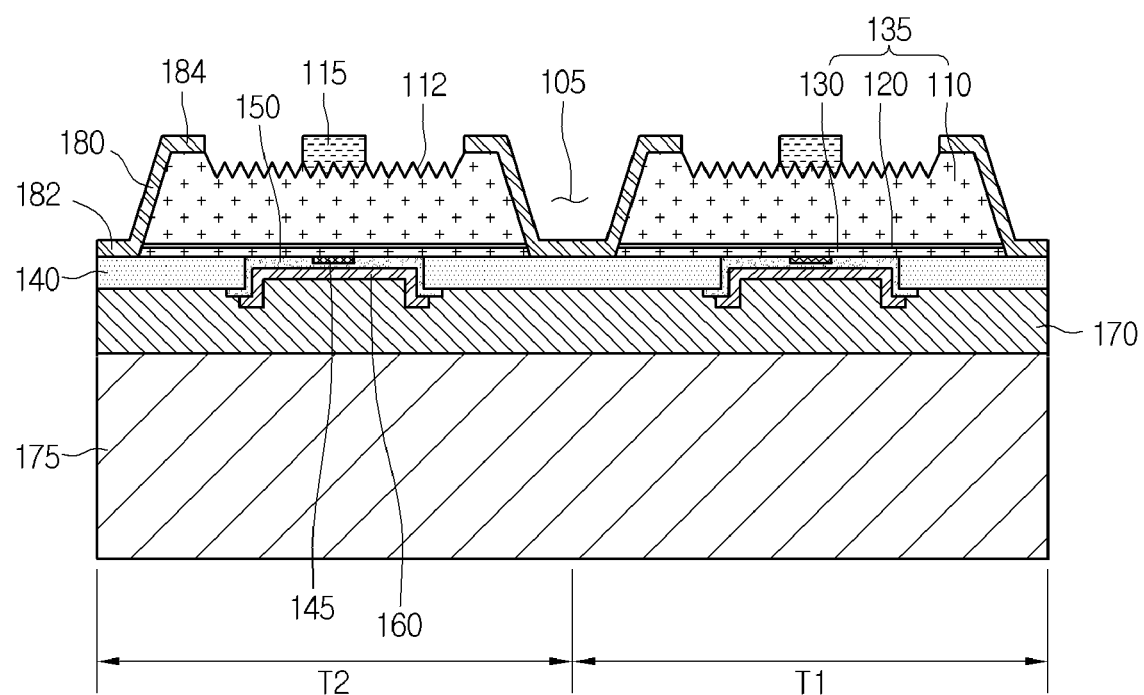

Referring to FIG. 10, the second electrode 115 is formed on the top surface of the light emitting structure 135 and the passivation layer 180 is formed on at least one lateral side of the light emitting structure 135.

The passivation layer 180 can be formed on at least one side of the light emitting structure 135 and on the protection layer 140 at the boundary region between the first and second chip regions T1 and T2. In detail, the passivation layer 180 makes contact with the top surface of the protection layer 140 at the boundary region between the first and second chip regions T1 and T2 and extends to the outer peripheral region of the top surface of the second conductive semiconductor layer 110 by passing or crossing through the first conductive semiconductor layer 130, the active layer 120 and the second conductive semiconductor layer 110.

The passivation layer 180 may prevent the electric short from occurring between the light emitting structure 135 and the first electrode 175. For instance, the passivation layer 180 may include an insulating material including one selected from the group consisting of $SiO_2$, $SiO_x$, $SiO_xN_y$, $Si_3N_4$, TiO2 and $Al_2O_3$, but the embodiment is not limited thereto.

The passivation layer 180 can be formed through the deposition process, such as E-beam evaporation, sputtering, and PECVD.

The roughness or the concavo-convex section 112 can be formed on the top surface of the second conductive semiconductor layer 110 exposed through the passivation layer 180 in order to improve the light extraction efficiency. The roughness or the concavo-convex section 112 may be formed after the unit chip regions have been formed through the isolation etching or the passivation layer 180 has been formed, but the embodiment is not limited thereto.

The roughness or the concavo-convex section 112 can be formed by performing the dry etching or the wet etching using the passivation layer 180 as a mask. Due to the passivation layer 180, the roughness or the concavo-convex section may not be formed on the top surface of the second conductive semiconductor layer 110 under the passivation layer 180.

The second electrode 115 may include an electrode pad area 116a to which a wire is bonded and a current spreading pattern 116b branching from the electrode pad area 116a to uniformly supply current over the whole area of the light emitting structure 135.

When viewed in a plan view, the electrode pad area 116a may have a rectangular shape, a circular shape, an oval shape, or a polygonal shape, but the embodiment is not limited thereto.

The second electrode 115 can be prepared as a single layer or a multiple layer by using at least one selected from the group consisting of Au, Ti, Ni, Cu, Al, Cr, Ag, and Pt.

The second electrode 115 can be formed through the plating process or the deposition process.

Figure 11:
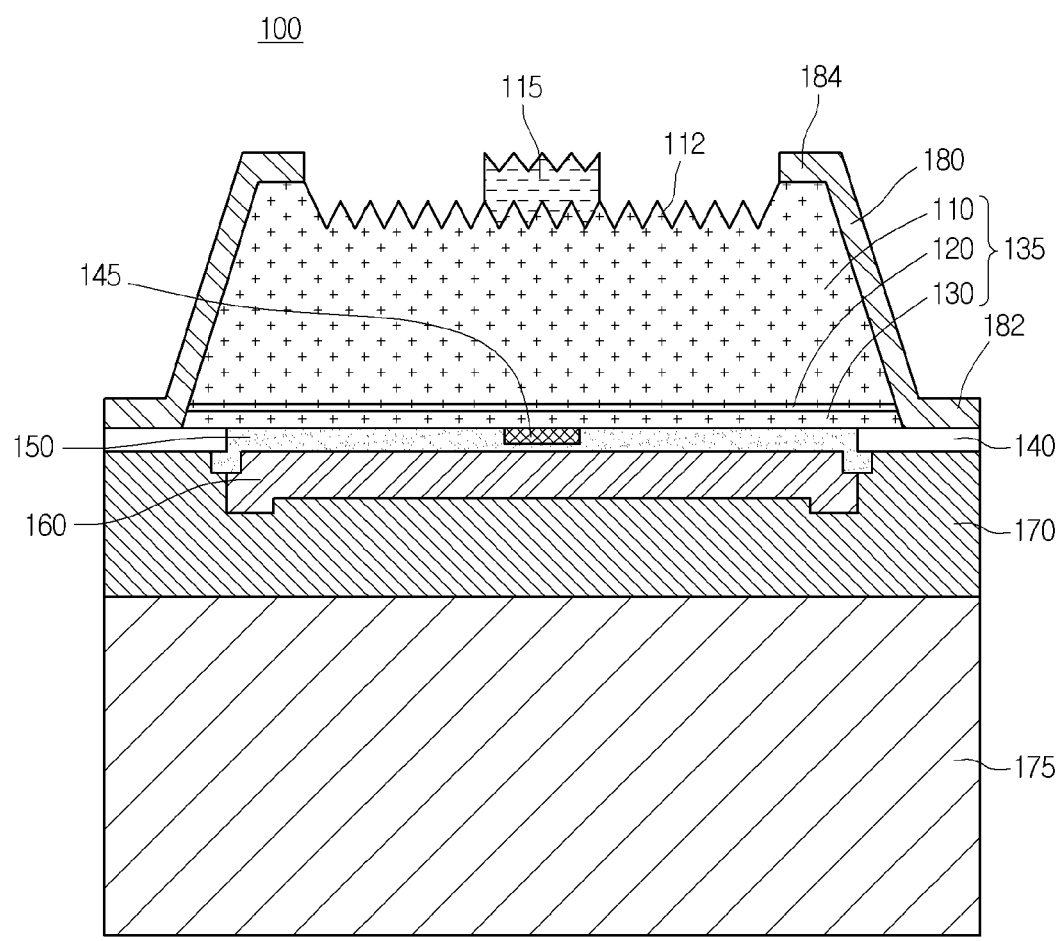

Referring to FIG. 11, the chip isolation process is performed to provide a plurality of individual chips by separating the first chip region T1 from the second chip region, thereby providing the light emitting device 100 according to the embodiment.

The chip isolation process may include a chip breaking process for separating the chip by applying physical power using a blade, a laser scribing process for separating the chip by irradiating laser onto the chip boundary region, and an etching process, such as a wet etching or a dry etching, but the embodiment is not limited thereto.

Hereinafter, the second embodiment will be described.

The second embodiment is similar to the first embodiment except that the protection layer 220 has a multi-layer structure. Thus, details of the elements and structures that have been previously described will be omitted or simplified to avoid redundancy and the same reference numerals will be assigned to the same elements.

Figure 12:
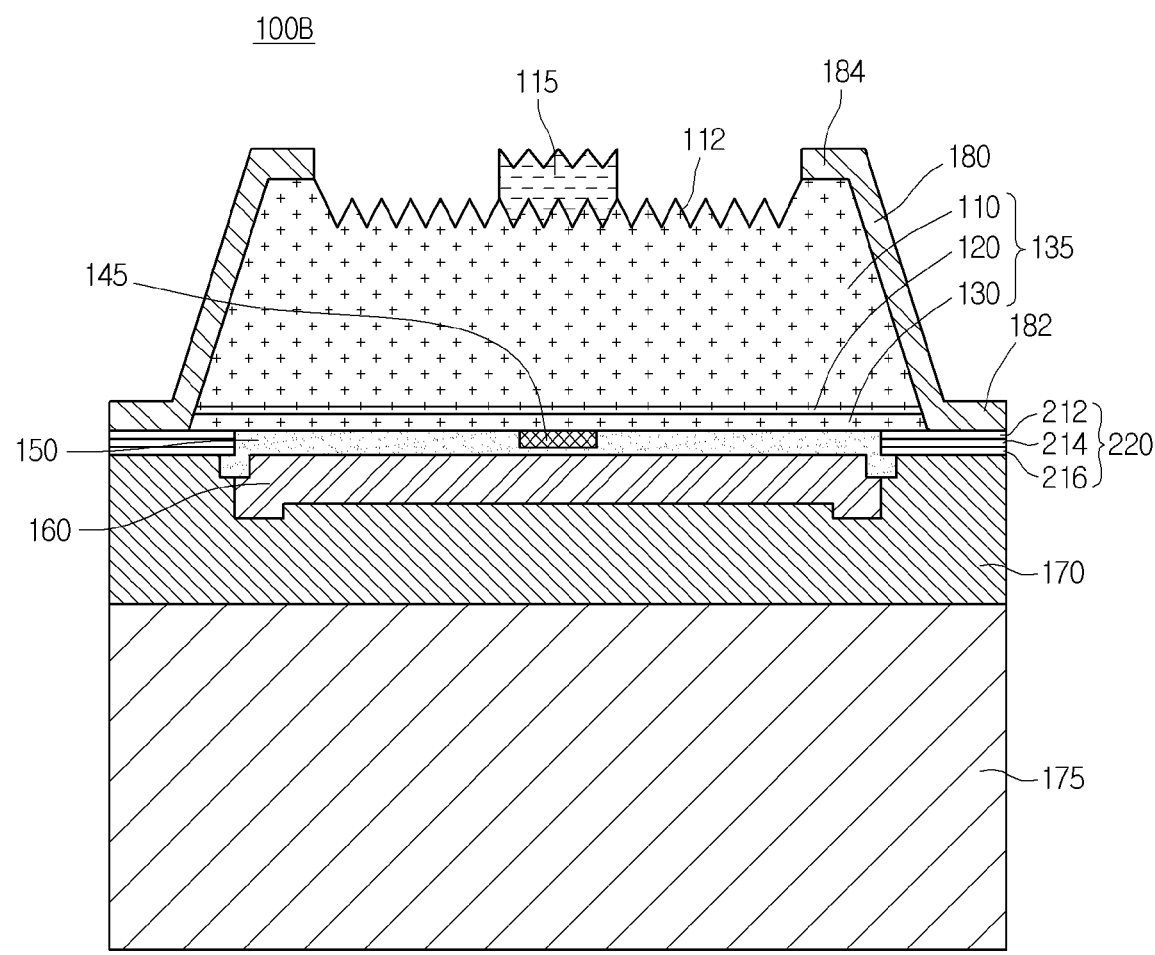
FIG. 12 is a side sectional view showing a light emitting device according to the second embodiment.

FIG. 12 is a side sectional view of the light emitting device 100B according to the second embodiment.

Referring to FIG. 12, the light emitting device 100B includes a first electrode 175, an adhesive layer 170 on the first electrode 175, a reflective layer 160 on the adhesive layer 170, an ohmic contact layer 150 on the reflective layer 160, a protection layer 220 having a multi-layer structure on a peripheral region of a top surface of the adhesive layer 170, a light emitting structure 135 formed on the ohmic contact layer 150 and the protection layer 220 to generate light, and a second electrode 115 on the light emitting structure 135.

Uppermost and lowermost layers of the protection layer 220 may include a first metallic material having superior adhesive property. For instance, the protection layer 220 may include three layers or more. Since the uppermost and lowermost layers of the protection layer 220 include the first metallic material having superior adhesive property, the light emitting structure 135 can be prevented from being delaminated from the adhesive layer 170.

For instance, the protection layer 220 may include first to third layers 212, 214, and 216. The first layer 212 and the third layer 216 may include the first metallic material including at least one selected from the group consisting of Ti, Ni, Au, Ag, Ta, Pt, Pd, Rh, Ir and W.

The second layer 214 disposed between the first and third layers 212 and 216 can be prepared as a single layer or a multi-layer by using at least one selected from the group consisting of an insulating material, a transparent conductive material, and a second metallic material.

For instance, the insulating material may include at least one selected from the group consisting of $SiO_2$, $SiO_x$, $SiO_xN_y$, $Si_3N_4$, $Al_2O_3$, and $TiO_x$.

The transparent conductive material may include at least one selected from the group consisting of ITO, IZO, IZTO, IAZO, IGZO, IGTO, AZO, ATO, and ZnO.

The second metallic material may include at least one selected from the group consisting of Ti, Al, W, Cu, Mo and Cr.

The second layer 214 may include a diffusion barrier layer, which is formed by using Ni, Ni-alloy, Ti, or Ti-alloy to prevent inter-diffusion.

Figure 13:
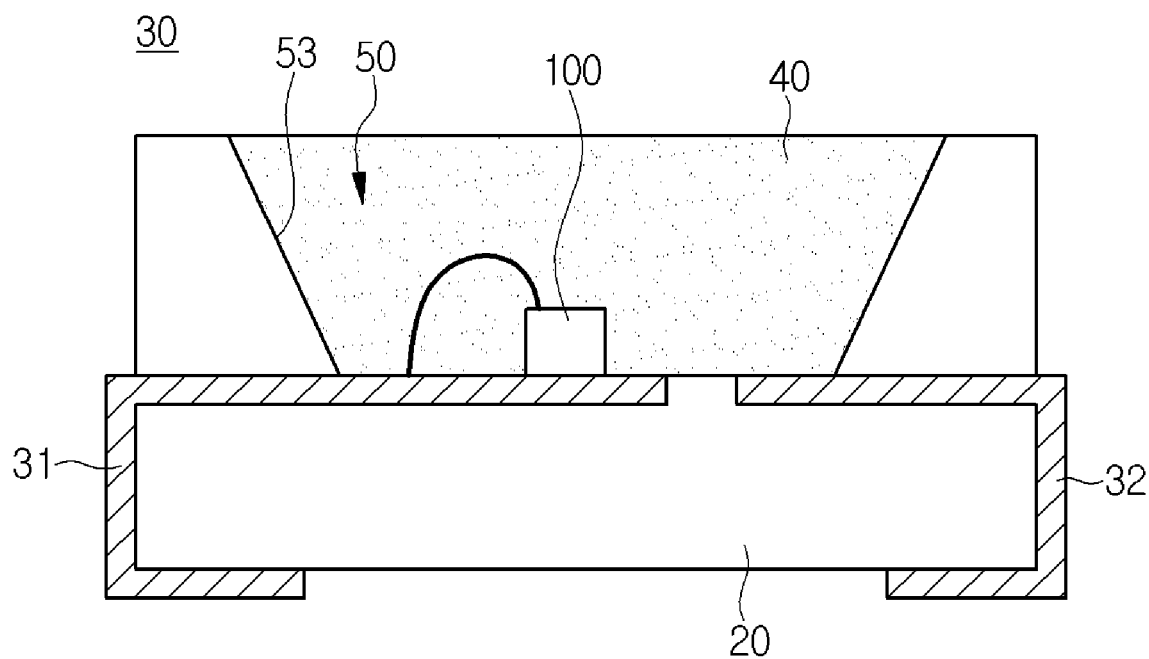
FIG. 13 is a sectional view showing a light emitting device package including a light emitting device according to the embodiment.

FIG. 13 is a sectional view showing a light emitting device package including the light emitting device according to the embodiments.

Referring to FIG. 13, the light emitting device package 30 includes a body 20, first and second lead electrodes 31 and 32 formed on the body 20, the light emitting device 100 provided on the body 20 and electrically connected to the first and second lead electrodes 31 and 32 and a molding member 40 that surrounds the light emitting device 100.

The body 20 may include silicon, synthetic resin or metallic material. When viewed from the top, the body 20 has a cavity 50 formed with an inclined inner wall 53.

The first and second lead electrodes 31 and 32 are electrically isolated from each other and formed by passing through the body 20. In detail, one ends of the first and second lead electrode layers 31 and 32 are disposed in the cavity 50 and the other ends of the first and second electrode layers 31 and 32 are attached to an outer surface of the body 20 and exposed to the outside.

The first and second lead electrode 31 and 32 supply power to the light emitting device 100 and improve the light efficiency by reflecting the light emitted from the light emitting device 1. Further, the first and second lead electrodes 31 and 32 dissipate heat generated from the light emitting device 100 to the outside.

The light emitting device 100 can be installed on the body 20 or the first or second lead electrode 31 or 32.

Wires 171 and 181 of the light emitting device 100 can be electrically connected to one of the first and second lead electrodes 31 and 32, but the embodiment is not limited thereto.

The molding member 40 surrounds the light emitting device 100 to protect the light emitting device 100. In addition, the molding member 40 may include phosphors to change the wavelength of the light emitted from the light emitting device 100.

Figure 14:
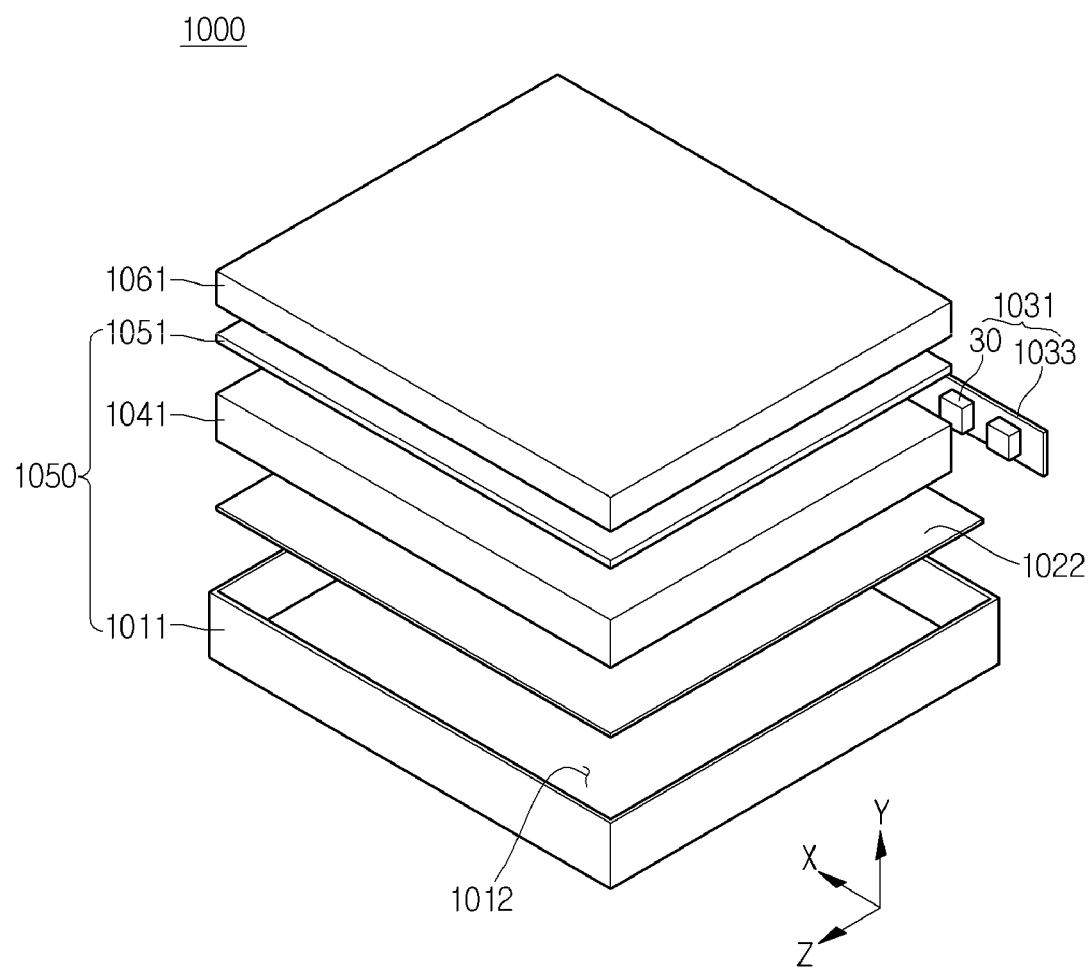
FIG. 14 is an exploded perspective view of a display device according to the embodiment.
Figure 15:
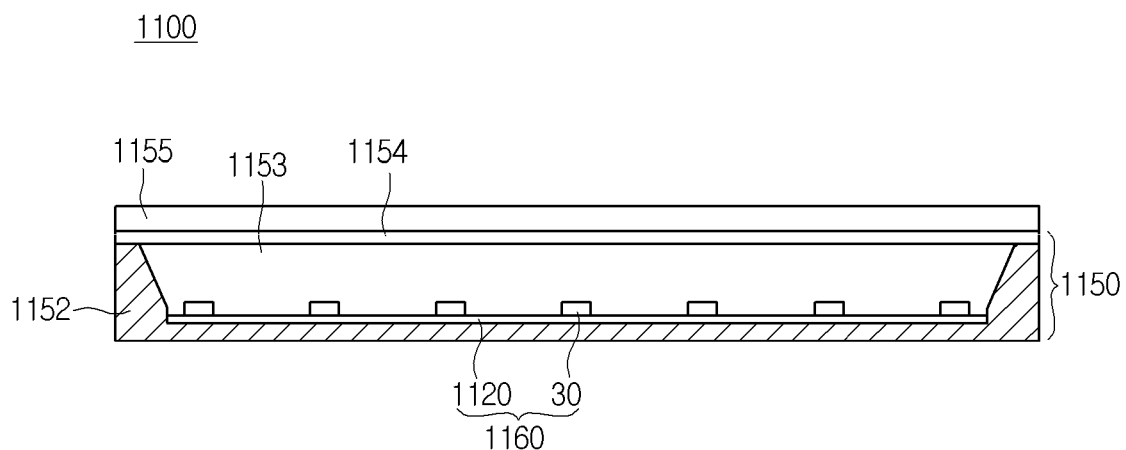
FIG. 15 is a sectional view showing a display device according to the embodiment.
Figure 16:
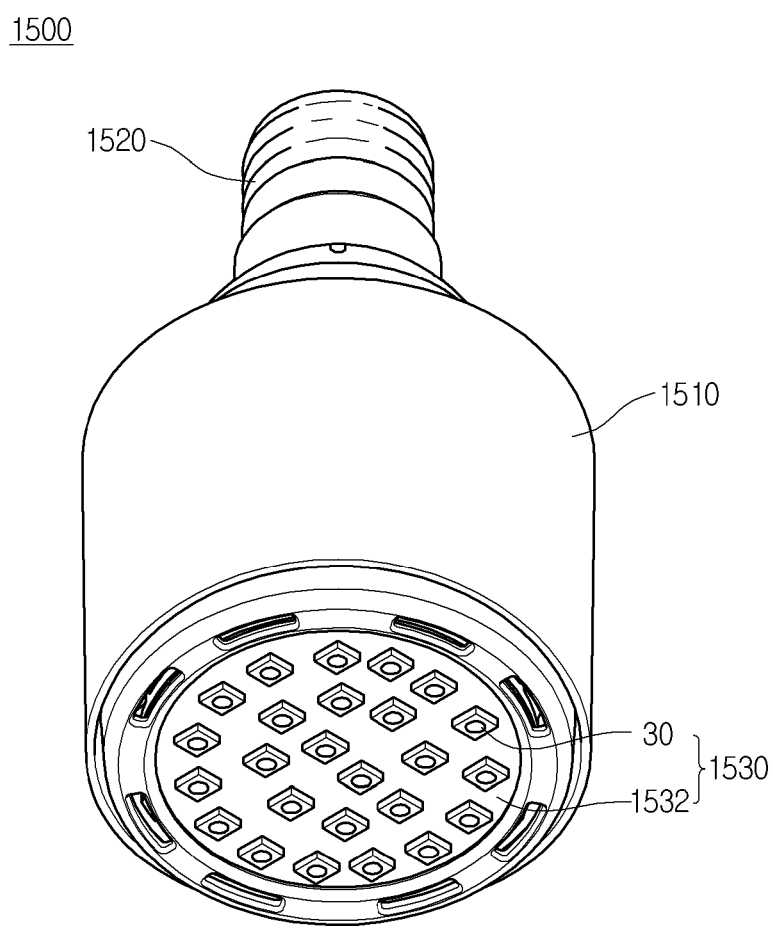
FIG. 16 is a perspective view showing a lighting device according to the embodiment.

The light emitting device 100 or the light emitting device package 30 according to the embodiment can be applied to the light unit. The light unit includes a plurality of light emitting devices or a plurality of light emitting device packages. The light unit may include the display device as shown in FIGS. 14 and 15 and the lighting device as shown in FIG. 16. In addition, the light unit may include a lighting lamp, a signal lamp, a headlight of a vehicle, and an electric signboard.

FIG. 14 is an exploded perspective view showing the display device according to the embodiment.

Referring to FIG. 14, the display device 1000 includes a light guide plate 1041, a light emitting module 1031 for supplying the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 for receiving the light guide plate 1041, the light emitting module 1031, and the reflective member 1022. However, the embodiment is not limited to the above structure.

The bottom cover 1011, the reflective sheet 1022, the light guide plate 1041 and the optical sheet 1051 may constitute a light unit 1050.

The light guide plate 1041 diffuses the light supplied from the light emitting module 1031 to provide surface light. The light guide plate 1041 may include transparent material. For instance, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphthalate) resin.

The light emitting module 1031 is disposed on at least one side of the light guide plate 1041 to supply the light to at least one side of the light guide plate 1041. The light emitting module 1031 serves as the light source of the display device.

At least one light emitting module 1031 is provided to directly or indirectly supply the light from one side of the light guide plate 1041. The light emitting module 1031 may include a substrate 1033 and light emitting device packages 30 according to the embodiments. The light emitting device packages 30 are arranged on the substrate 1033 while being spaced apart from each other at the predetermined interval. The substrate 1033 may include a printed circuit board (PCB), but the embodiment is not limited thereto. In addition, the substrate 1033 may also include a metal core PCB (MCPCB) or a flexible PCB (FPCB), but the embodiment is not limited thereto. If the light emitting device packages 30 are installed on the side of the bottom cover 1011 or on a heat dissipation plate, the substrate 1033 may be omitted. The heat dissipation plate partially makes contact with the top surface of the bottom cover 1011. Thus, the heat generated from the light emitting device packages 30 can be emitted to the bottom cover 1011 through the heat dissipation plate.

In addition, the light emitting device packages 30 are arranged such that light exit surfaces of the light emitting device packages 30 are spaced apart from the light guide plate 1041 by a predetermined distance, but the embodiment is not limited thereto. The light emitting device packages 30 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is traveled downward through the bottom surface of the light guide plate 1041, toward the display panel 1061, thereby improving the brightness of the display panel 1061. For instance, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for instance, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by blocking the light generated from the light emitting module 1031 or allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmittive sheet. For instance, the optical sheet 1051 includes at least one selected from the group consisting of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be provided on the display panel 1061, but the embodiment is not limited thereto.

The light guide plate 1041 and the optical sheet 1051 can be provided in the light path of the light emitting module 1031 as optical members, but the embodiment is not limited thereto.

FIG. 15 is a sectional view showing a display device according to the embodiment.

Referring to FIG. 15, the display device 1100 includes a bottom cover 1152, a substrate 1120 on which the light emitting device packages 30 are arranged, an optical member 1154, and a display panel 1155.

The substrate 1120 and the light emitting device packages 30 may constitute the light emitting module 1060. In addition, the bottom cover 1152, at least one light emitting module 1060, and the optical member 1154 may constitute the light unit.

The bottom cover 1151 can be provided with a receiving section 1153, but the embodiment is not limited thereto.

The optical member 1154 may include at least one selected from the group consisting of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto the display panel 1155, and the brightness enhanced sheet improves the brightness by reusing the lost light.

The optical member 1154 is disposed above the light emitting module 1060 in order to convert the light emitted from the light emitting module 1060 into the surface light. In addition, the optical member 1154 may diffuse or collect the light.

FIG. 16 is a perspective view showing a lighting device according to the embodiment.

Referring to FIG. 16, the lighting device 1500 includes a case 1510, a light emitting module 1530 installed in the case 1510, and a connection terminal 1520 installed in the case 1510 to receive power from an external power source.

Preferably, the case 1510 includes material having superior heat dissipation property. For instance, the case 1510 includes metallic material or resin material.

The light emitting module 1530 may include a substrate 1532 and light emitting device packages 30 installed on the substrate 1532. The light emitting device packages 30 are spaced apart from each other or arranged in the form of a matrix.

The substrate 1532 includes an insulating member printed with a circuit pattern. For instance, the substrate 1532 includes a PCB, an MCPCB, an FPCB, a ceramic PCB, and an FR-4 substrate.

In addition, the substrate 1532 may include material that effectively reflects the light. A coating layer can be formed on the surface of the substrate 1532. At this time, the coating layer has a white color or a silver color to effectively reflect the light.

At least one light emitting device package 30 is installed on the substrate 1532. Each light emitting device package 30 may include at least one LED (light emitting diode) chip. The LED chip may include an LED that emits the light of visible ray band having red, green, blue or white color and a UV (ultraviolet) LED that emits UV light.

The light emitting device packages 30 of the light emitting module 1530 can be variously combined to provide various colors and brightness. For instance, the white LED, the red LED and the green LED can be combined to achieve the high color rendering index (CRI).

The connection terminal 1520 is electrically connected to the light emitting module 1530 to supply power to the light emitting module 1530. The connection terminal 1520 has a shape of a socket screw-coupled with the external power source, but the embodiment is not limited thereto. For instance, the connection terminal 1520 can be prepared in the form of a pin inserted into the external power source or connected to the external power source through a wire.

Meanwhile, the method of manufacturing the light emitting device includes the steps of forming the light emitting structure, forming the protection layer including the metallic material on the chip boundary region between the chips that define the unit light emitting structure, forming the first electrode including the support member having conductivity on the protection layer and the light emitting structure, and forming the second electrode on the light emitting structure in opposition to the first electrode.

According to the embodiment, the protection layer includes the metallic material having superior adhesive property, so that the adhesive strength between the light emitting structure and the adhesive layer can be reinforced. Thus, the light emitting structure may not be delaminated from the adhesive layer, so that the reliability of the light emitting device can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a light emitting structure including a first semiconductor layer, an active layer, and a second semiconductor layer;
a first electrode on the light emitting structure;
a protection layer including a plurality of layers on an outer peripheral region of one of the light emitting structure and the first electrode, an adhesive layer on the first electrode; a reflective layer on the adhesive layer; an ohmic contact on the reflective layer; and a current blocking layer on the ohmic contact; and wherein the adhesive layer, the reflective layer, the ohmic contact, and the current blocking layer are formed between the first electrode and the light emitting structure,
wherein a lowermost layer and an uppermost layer of the protection layer includes a first metallic material, wherein the lowermost layer physically contacts the adhesive layer, and the uppermost layer physically contacts the first semiconductor layer, and wherein the lowermost layer includes a bottom surface, a top surface, and a side surface which are planar surfaces.

2. The light emitting device of claim 1, wherein at least one single layer of the plurality layers including at least one selected from the group consisting of Ti, Ni, Au, Ag, Ta, Pt, Pd, Rh, Ir and W.

3. The light emitting device of claim 1, wherein the first metallic material includes at least one selected from the group consisting of Ti, Ni, Au, Ag, Ta, Pt, Pd, Rh, Ir and W.

4. The light emitting device of claim 1, wherein a plurality of intermediate layers between the uppermost layer and the lowermost layer include at least one selected from the group consisting of an insulating material, a conductive material, and a second metallic material.

5. The light emitting device of claim 4, wherein the insulating material includes at least one selected from the group consisting of $SiO_2$, $SiO_x$, $SiO_xN_y$, $Si_3N_4$, $Al_2O_3$, and $TiO_x$.

6. The light emitting device of claim 4, wherein the conductive material includes at least one selected from the group consisting of ITO, IZO, IZTO, IAZO, IGZO, IGTO, AZO, ATO, and ZnO.

7. The light emitting device of claim 4, wherein the second metallic material includes at least one selected from the group consisting of Ti, Al, W, Cu, Mo and Cr.

8. The light emitting device of claim 4, wherein at least one of the plurality of intermediate layers between the uppermost layer and the lowermost layer includes a diffusion barrier layer.

9. The light emitting device of claim 8, wherein the diffusion barrier layer includes at least one selected from the group consisting of Ni, Ti, a Ni alloy and a Ti alloy.

10. The light emitting device of claim 1, wherein the first metallic material is configured to form an ohmic contact with the first semiconductor layer.

11. The light emitting device of claim 10, wherein the first metallic material includes one of Ti, Ni and W.

12. The light emitting device of claim 1, wherein the first electrode includes a support member having conductivity.

13. The light emitting device of claim 1, wherein the second semiconductor layer comprising a concave-convex top surface.

14. The light emitting device of claim 1, further comprising a second electrode on the second semiconductor layer.

15. A light emitting device comprising:
an electrode including a support member having conductivity;
an adhesive layer on the electrode;
a protection layer including a plurality of layers on an outer peripheral region of a top surface of the electrode;
a light emitting structure including a first semiconductor layer, an active layer, and a second semiconductor layer on the electrode and the protection layer; a reflective layer on the adhesive layer; an ohmic contact on the reflective layer; and a current blocking layer on the ohmic contact; and wherein the adhesive layer, the reflective layer, the ohmic contact, and the current blocking layer formed between the electrode and the light emitting structure,
wherein the protection layer includes a first layer physically contacting the adhesive layer, a second layer on the first layer, and a third layer physically contacting the first semiconductor layer, the first and the third layers include a first metallic material, and the second layer includes at least one selected from the group consisting of an insulating material, a conductive material, and a second metallic material, and wherein the first layer includes a bottom surface, a top surface, and a side surface which are planar surfaces.

* * * * *